US012563714B2

(12) United States Patent
Mathur et al.

(10) Patent No.: US 12,563,714 B2
(45) Date of Patent: Feb. 24, 2026

(54) BURIED SIGNAL WIRES FOR MEMORY APPLICATIONS

(71) Applicant: Arm Limited, Cambridge (GB)

(72) Inventors: Rahul Mathur, Austin, TX (US); Mudit Bhargava, Austin, TX (US); Saurabh Pijuskumar Sinha, Schertz, TX (US); Brian Tracy Cline, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 424 days.

(21) Appl. No.: 18/012,917

(22) PCT Filed: Jun. 23, 2021

(86) PCT No.: PCT/GB2021/051598
§ 371 (c)(1),
(2) Date: Dec. 24, 2022

(87) PCT Pub. No.: WO2021/260377
PCT Pub. Date: Dec. 30, 2021

(65) Prior Publication Data
US 2023/0354571 A1      Nov. 2, 2023

Related U.S. Application Data

(60) Provisional application No. 63/175,854, filed on Apr. 16, 2021, provisional application No. 63/043,211, filed on Jun. 24, 2020.

(51) Int. Cl.
*H10B 10/00*          (2023.01)

(52) U.S. Cl.
CPC ..................................... *H10B 10/12* (2023.02)

(58) Field of Classification Search
CPC ............................... H10B 10/12; G11C 5/063
See application file for complete search history.

(56) References Cited

U.S. PATENT DOCUMENTS

| | | | |
|---|---|---|---|
| 8,395,191 | B2 | 3/2013 | Or-Bach et al. |
| 9,099,526 | B2 | 8/2015 | Or-Bach et al. |
| 2011/0227145 | A1 | 9/2011 | Renn |
| 2012/0248595 | A1 | 10/2012 | Or-Bach et al. |
| 2014/0085979 | A1 | 3/2014 | Kono |

(Continued)

FOREIGN PATENT DOCUMENTS

| | | |
|---|---|---|
| KR | 20060126795 A | 12/2006 |
| KR | 20100082341 A | 7/2010 |
| KR | 20200028500 A | 3/2020 |

OTHER PUBLICATIONS

TIPO Office Action; TW 110122874; Jan. 22, 2025.

(Continued)

*Primary Examiner* — Walter H Swanson
(74) *Attorney, Agent, or Firm* — Pramudji Law Group PLLC; Ari Pramudji

(57) ABSTRACT

Various implementations described herein refer to a device having a memory structure with a substrate. The device may have a signal wire buried or partially buried within at least one of the substrate and a dielectric for transmitting electrical signals. The device may be manufactured as a memory device having a memory cell structure with the signal wire buried or partially buried in the substrate.

20 Claims, 6 Drawing Sheets

300

Memory Architecture 303

(56)                    References Cited

U.S. PATENT DOCUMENTS

2015/0061054 A1      3/2015  Kim et al.
2020/0161311 A1*    5/2020  Pille ....................... H10B 10/12

OTHER PUBLICATIONS

PCT International Search Report and Written Opinion; PCT/GB2021/
051598; Aug. 27, 2021.
KR 10-2023-7002309 Notification of Grounds for Refusal dated
Sep. 2, 20247, pp. 1-17.
TIPO Final Rejection / Office Action; TW 110122874; Sep. 25,
2025.
KIPO Allowance; KR 10-2023-7002309; Jul. 23, 2025.

\* cited by examiner

200

Memory Architecture 204

300

Memory Architecture 303

400

Memory Architecture 404

500

Memory Architecture 504

600

610 ── provide a memory cell structure disposed on a substrate

620 ── bury a signal wire in the substrate for transmitting electrical signals to the memory cell structure 630 ── manufacture, or cause to be manufactured, a memory device having the memory cell structure with the signal wire buried in the substrate

BURIED SIGNAL WIRES FOR MEMORY APPLICATIONS

RELATED APPLICATIONS

This application claims priority to and the benefit of Provisional Patent Application No. 63/043,211, entitled "Method of Fabrication of Buried Signal Wires in Memories," filed Jun. 24, 2020, which is hereby incorporated by reference in its entirety. Also, this application claims priority to and the benefit of Provisional Patent Application No. 63/175,854, entitled "Buried Interconnects for Sub-5 nm SRAM Design," filed Apr. 16, 2021, which is also hereby incorporated by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory designs, traditional interconnect wires are typically situated in a plurality of layers above the substrate and, in particular, above transistors, such as MOSFETs (metal-oxide-semiconductor field effect transistors), to enable interconnection between memory components in an integrated circuit (IC). Unfortunately, these conventional memory designs are highly congested and often cause reduced performance due to parasitic resistance and capacitance effects. Also, traditional routing layers typically refer to frontside routing layers that are situated above the substrate and other components of an integrated circuit (IC), which further causes congestive issues with modern physical layout designs. As such, there exists a need to improve area efficiency with reduced wire congestion in a manner that allows for improved routing between memory devices in modern circuit designs.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to schemes and techniques for providing memory architecture with buried signal lines in physical layout designs of multi-layered structural configurations. For instance, various physical layout design schemes and techniques described herein may provide for enhanced memory structures including various types of random access memory (RAM) architectures and configurations. Also, the various implementations described herein are related to a method for fabricating buried signal wires in various fabricated memory devices, such as, e.g., random access memory (RAM) devices including SRAM, DRAM, eDRAM, MRAM, ReRAM, CeRAM and NVRAM, along with various other fabricated memory devices, such as, e.g., PCM, FLASH and ROM.

Various advantages and benefits may be achieved with implementing the memory architecture schemes and techniques as described herein. Various configurations described herein provide schemes and techniques for fabricating memory signal wires that are buried within an integrated circuit. For instance, the buried signal wires may be disposed within the substrate of an integrated circuit, wherein the buried signal wires may reduce congestion of metal routing layers. The buried signal wires may also provide lower resistance and/or lower capacitance memory signal routing when compared with traditional non-buried wires, thereby decreasing signal delay and energy consumption. Also, using buried signal wires in memory devices may have a significant impact on memory performance by simultaneously reducing memory access time, improving cycle time, reducing dynamic energy consumption and also increasing memory density. In addition, as the buried signal wire layer is less congested, the signals may be wider and/or disposed further apart to reduce resistance. In some instances, resistance of the wires may be further reduced by making the buried signal wire layer taller, and buried signal wires may be applied to unidirectional and non-unidirectional signals.

In various implementations, buried signal wires may have lower capacitance and resistance, due to reduced signal coupling, when compared to similar non-buried signal wires of the same wire width. Also, various other critical signal wires for memory wordlines, bitlines and/or clock signals may be implemented as buried signal wires so as to provide improved memory performance and lower energy consumption when compared to implementing non-buried signal wires that use traditional above-substrate connectivity.

Various implementations of providing memory architecture with buried signal lines will be described herein with reference to FIGS. 1-6.

Figure 1:
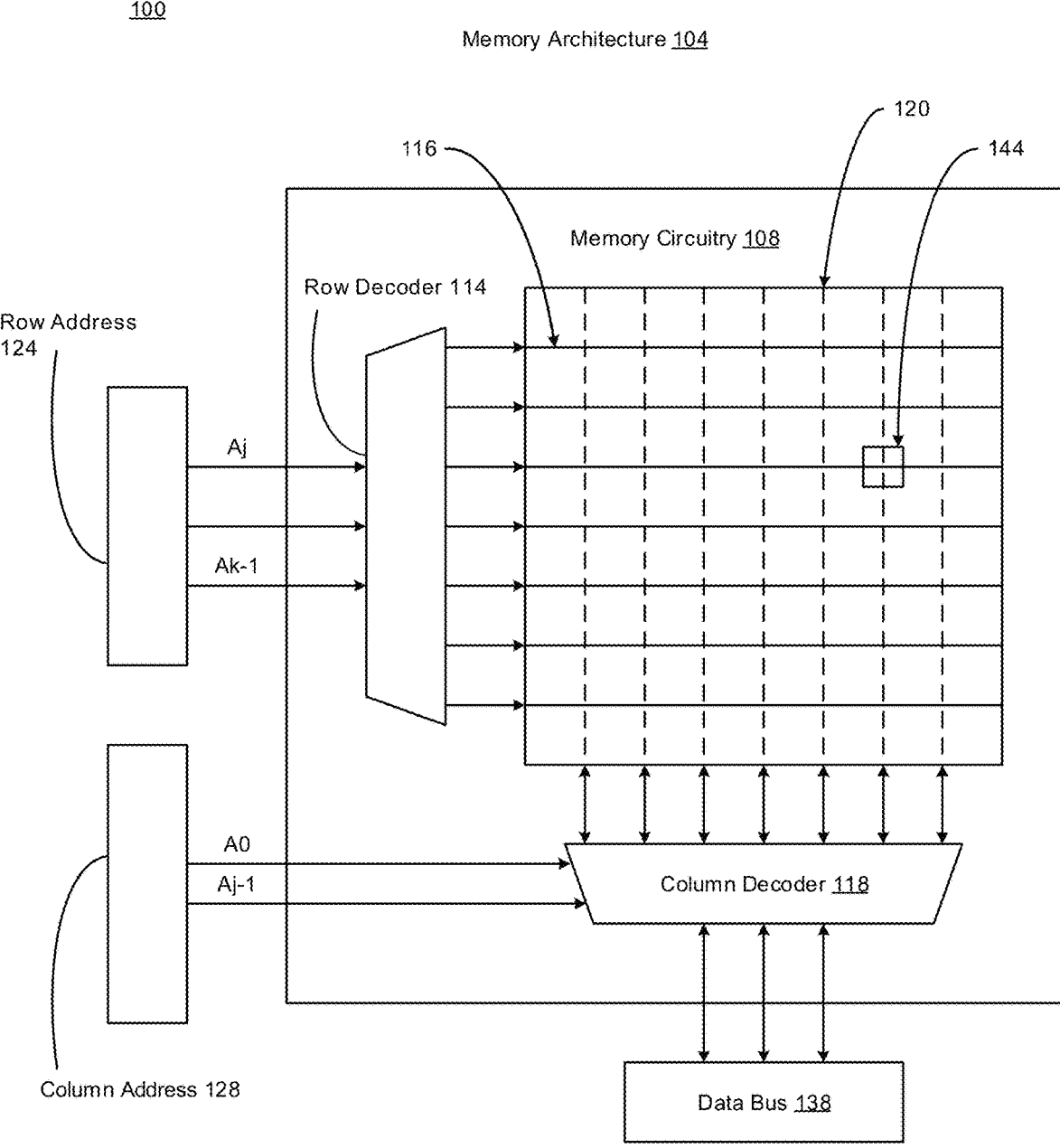
FIG. 1 illustrates a diagram of memory architecture having addressable storage elements in accordance with various implementations described herein.

FIG. 1 illustrates a diagram 100 of memory architecture 104 having addressable storage elements 144 in accordance with various implementations described herein.

In various implementations, the memory architecture 104 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing memory architecture 104 as an integrated system or device may involve use of the various IC circuit components described herein so as to implement various related fabrication schemes and techniques associated therewith. Moreover, the memory architecture 104 may be integrated with computing circuitry and related components on a single chip, and the memory architecture 104 may be implemented and/or incorporated in various embedded systems for various automotive, electronic, mobile, server and Internet-of-things (IoT) applications, including remote sensor nodes.

As shown in FIG. 1, the memory architecture 104 may include memory circuitry 108 with an array of addressable storage elements 144, such as, e.g., various types of bitcells or other memory cells. In some implementations, the memory circuitry 108 may refer to a two-dimensional (2D) array of addressable memory storage elements 144 that are accessed with an address having a first portion of the address used as a row address 120 and second portion of the address used as a column address 128. The row address 128 (Aj to Ak−1) may be provided to and decoded by a row decoder 114, and a corresponding wordline (WL) 116 may be activated. The activated wordline wire 116 is used to select a corresponding row of storage elements 114 to be activated, and also, data from the activated row may be written to or read from a corresponding bitline wire 120. The column address 128 (A0 to Aj−1) may be provided to and decoded by a column multiplexer 118, and a corresponding bitline (BL) 120 may be activated. In this instance, the column address 128 (A0 to Aj−1) may be used to select appropriate data from corresponding bitlines (BL) 120 so as to drive the selected data on a data bus 138. Further, the memory circuitry 108 may use a clock to synchronize memory access events (read/write operations), and also, the clock may be critical for memory access timing, such as, e.g., memory access time, cycle time, setup and/or hold times.

Figure 2:
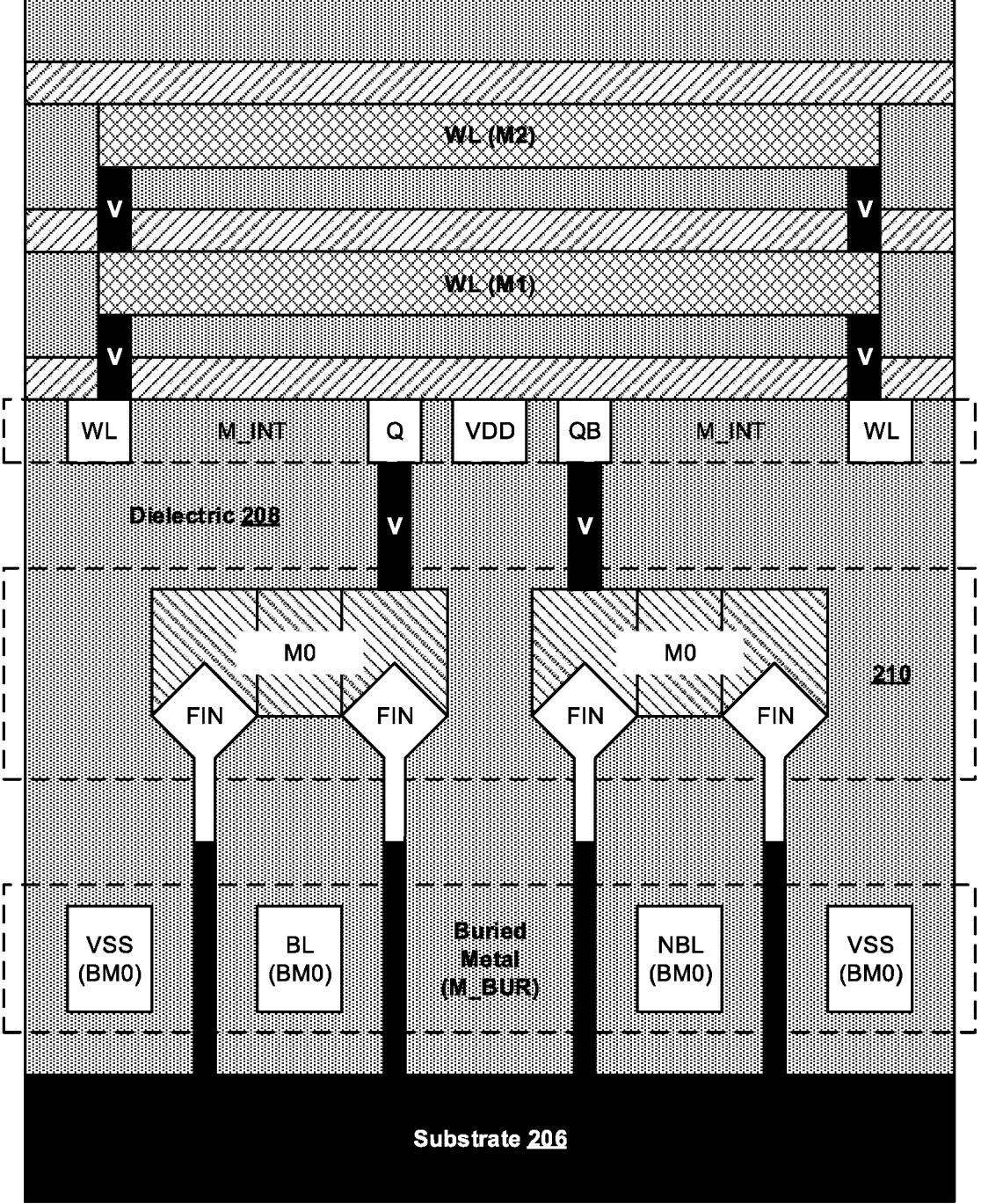
FIGS. 2-5 illustrate various diagrams of memory architecture with buried metal lines in accordance with various implementations described herein.

FIG. 2 illustrates a diagram 200 of memory architecture 204 having buried metal lines (M_BUR) in accordance with various implementations described herein.

In various implementations, the memory architecture 204 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing memory architecture 204 as an integrated system or device may involve use of the various IC circuit components described herein so as to implement various related fabrication schemes and techniques associated therewith. Also, the memory architecture 204 may be integrated with computing circuitry and related components on a single chip, and the memory architecture 204 may be implemented and/or incorporated in various embedded systems for various automotive, electronic, mobile, server and Internet-of-things (IoT) applications, including remote sensor nodes.

As shown in FIG. 2, the memory architecture 204 may include a multi-layered memory structure with a substrate 206 and one or more signal wires (e.g., BM0) buried within the substrate 206 or dielectric 208 for transmitting electrical signals. The one or more signal wires (e.g., BM0) may be referred to as buried metal (M_BUR) that is disposed within the substrate 206 and also surrounded (or enclosed) with a dielectric material 208. In some instances, the electrical signals may refer to various types of critical signals (wordline signals, bitline signals and clock signal) that are transmitted to the memory structure for memory related applications.

In some implementations, the memory structure may refer to a transistor 210, such as, e.g., a fin field-effect transistor (FinFET), that is disposed on the substrate 206, and the electrical signals may refer to various critical signals that are transmitted to the transistor 210 for memory related applications. In some instances, a signal wire (BM0) may be coupled to the transistor 210 with a buried via (BV) or a through-silicon via (TSV). Also, the signal wire (BM0) may refer to a wordline (WL), a bitline (BL) or clock signal line (CSL) that is buried in the substrate 206. In some instances, the signal wire (BM0) may refer to one or more bitlines (e.g., BL/NBL) buried in a dielectric region that is filled with the dielectric material 208. The transistor 210 may have one or more poly-gate (PG) regions formed above the substrate 206.

In other implementations, the signal wire (BM0) may refer to multiple signal wires (e.g., BM0: VSS, BL, NBL) that are buried in the substrate 206 for transmitting the electrical signals to the transistor 210 (or memory cell structure). The critical signals may refer to data signals or clock signals that are transmitted to the memory cell structure for memory related applications. Also, the critical signals may refer to one or more wordline (WL) signals that are transmitted on the at least one wordline (WL) to the memory cell structure, and the critical signals may refer to one or more bitline (BL) signals that are transmitted on the at least one bitline (BL) to the memory cell structure. Also, the multiple signals wires may refer to a buried wordline (WL) coupled to a gate of the transistor 210 with a first buried via (BV), and also, the multiple signals wires may refer to a buried bitline (BL/NBL) that is coupled to a drain of the transistor 210 with a second buried via (BV). Also, in some instances, the buried wordline (WL) may refer to a buried global wordline (GWL) that is coupled to the gate of the transistor 210 with the first buried via (BV). The buried WL and the buried BL are described in greater detail herein in reference to FIGS. 3-5.

In various implementations, the multiple signal wires may include at least one clock signal line that is buried within the substrate 206, and the critical signals may refer to one or more clock signals that are transmitted on the at least one clock signal line to the memory cell structure (e.g., 210). The multiple signal wires may also refer to at least one critical signal line (e.g., WL, BL, NBL) that is buried within the substrate 206 for transmitting critical signals (e.g., WL/BL/NBL signals) to the memory cell structure (e.g., 210). Also, the multiple signal wires may include at least one power signal line (e.g., VSS, VDD) that is buried within the substrate 206 for transmitting power signals (e.g., VSS/VDD signals) to the memory cell structure (e.g., 210). Also, in various instances, the at least one critical signal line (e.g., WL, BL, NBL) is separate from the at least one power signal line (e.g., VSS, VDD). The buried critical signal lines are described in greater detail herein in reference to FIGS. 3-5.

Also, as shown in FIG. 2, the memory structure may include multiple wordlines (WL) disposed in multiple layers (e.g., M0, M_INT, M1, M2), and the multiple wordlines (WL) may be coupled together by way of vias (V). In some implementations, the vias (V) may refer to buried vias (BV) that are buried in the dielectric material 208. Also, in an intermediate metal layer (M_INT), other signal lines for wordlines (WL), output lines (Q/QB) and a source power line (VDD) may be disposed therein. Also, in some instances, the output lines (Q/QB) may be coupled to the memory cell structure (e.g., 210) by way of vias (V) or buried vias (BV) that are buried within the dielectric material 208.

In various implementations, the memory structure may refer to various fabricated memory devices, such as, e.g., random access memory (RAM) devices including SRAM, DRAM, eDRAM, MRAM, ReRAM, CeRAM and NVRAM, along with various other fabricated memory devices, such as, e.g., PCM, FLASH and ROM. Also, in various implementations, the memory cell structure (e.g., 210) may refer to various types of bitcells, such as, e.g., an SRAM bitcell, a DRAM bitcell, an eDRAM bitcell, an MRAM bitcell, a ReRAM bitcell, a PCM bitcell, a CeRAM bitcell, a FLASH bitcell, an NVRAM bitcell or a ROM bitcell.

Figure 3:
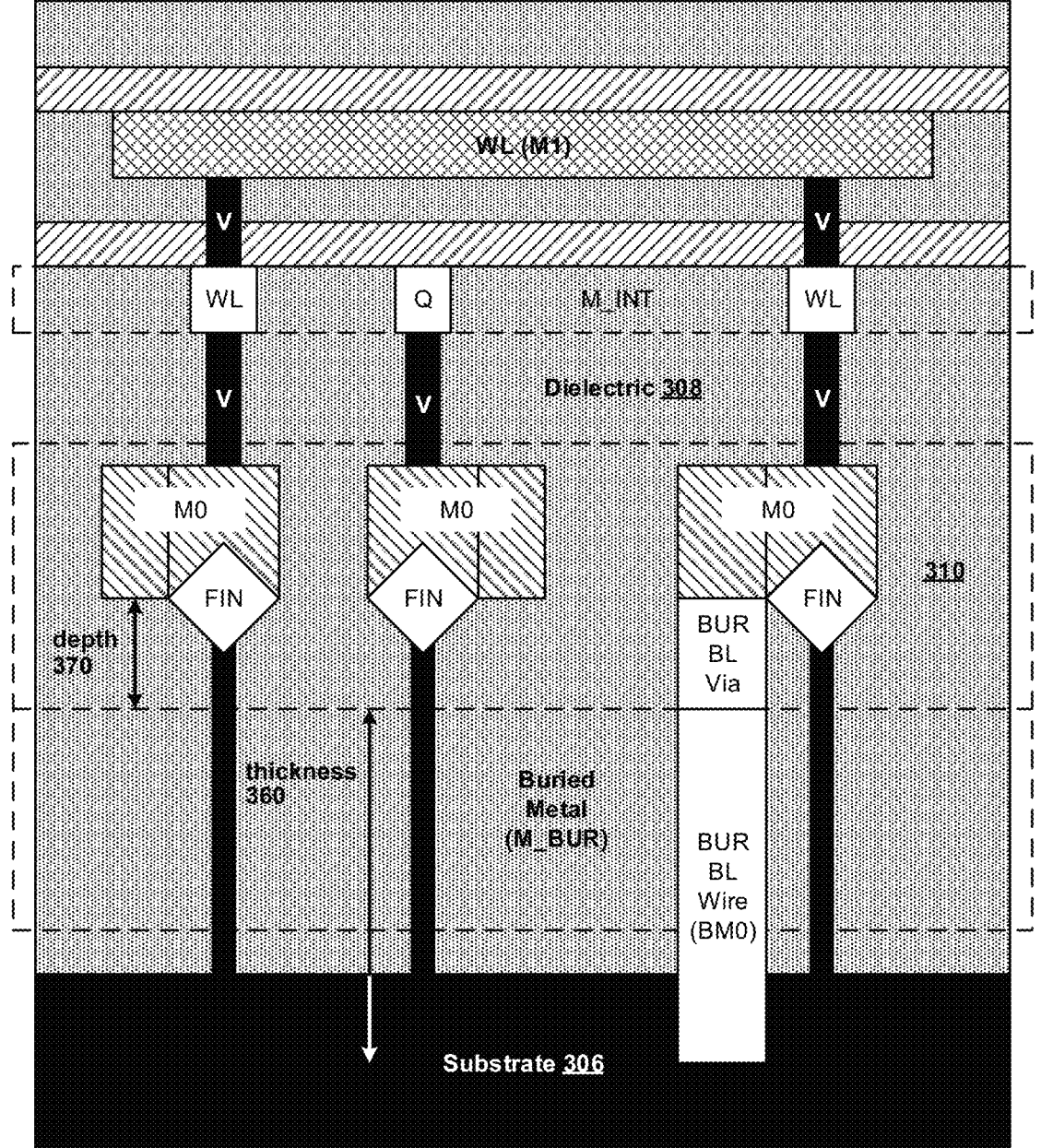

FIG. 3 illustrates a diagram 300 of memory architecture 304 having buried metal lines (M_BUR) in accordance with various implementations described herein. It should be appreciated that the memory architecture 304 as shown in FIG. 3 may be similar in scope and features to the memory architecture 204 shown in FIG. 2, wherein similar components have similar features, characteristics and related behaviors.

In various implementations, the memory architecture 304 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing memory architecture 304 as an integrated system or device may involve use of the various IC circuit components described herein so as to implement various related fabrication schemes and techniques associated therewith. Also, the memory architecture 304 may be integrated with computing circuitry and related components on a single chip, and the memory architecture 304 may be implemented and/or incorporated in various embedded systems for various automotive, electronic, mobile, server and Internet-of-things (IoT) applications, including remote sensor nodes.

As shown in FIG. 3, the memory architecture 304 may include a multi-layered memory structure with a substrate 306 and one or more signal wires (e.g., BM0) buried within the substrate 306 for transmitting electrical signals. The one or more signal wires (e.g., BM0) may be referred to as buried metal (M_BUR) that is disposed within the substrate 306 and also surrounded (or enclosed) with a dielectric material 308. In some instances, the electrical signals may refer to various types of critical signals (wordline signals, bitline signals and clock signal) that are transmitted to the memory structure for memory related applications.

In some implementations, the memory architecture 304 as shown in FIG. 3 refers to a multi-layered memory structure having a buried bitline signal wire (BM0) with a thickness 360 and depth 370 from an upper surface of the substrate 306. The buried bitline signal wire (BM0) may include a buried via (e.g., BUR BL Wire+BUR BL Via). In some instances, the via refers to an electrical connection between layers of a physical electronic circuit, and also, the buried via may refer to a via that is buried within the substrate 306. Also, the memory structure may refer to a FinFET type transistor 310 having transistors fins (FIN), wherein the transistor 310 refers to a semiconductor device that is used as a switch or as a signal amplifier to amplify electronic signals. In some instances, the FinFET may have at least three terminals, such as, e.g., a source terminal, a gate terminal and a drain terminal. In advanced process technologies, FinFET type transistors may refer to three-dimensional (3D) memory structures that are disposed above the substrate 306 and resemble fins.

In some instances, the fins (FIN) of the transistor 310 form the source and drain of the transistor 310 and metal routing layers may be disposed above the substrate 306. The metal routing layers provide electronic interconnects, and the metal routing layers may be used to form electronic circuits. Also, as shown in FIG. 3, the memory structure may have multiple metal routing layers (e.g., M0, M1, etc.) with the metal layer closest to the substrate 306 being a first metal layer (M0) with additional metal layers being incrementally numbered (e.g., M1) based on its position relative to the substrate 306. In some instances, the poly gate (PG) may be formed above the substrate 206, and the wordline (WL) may be formed in another metal layer (M1). Also, other wordlines (WL) and the output line (Q) may be formed in the intermediate metal layer (M_INT).

In some instances, the buried bitline wire (BUR BL Wire) may be implemented as a buried signal wire, and the buried bitline wire (BL) and its complement buried bitline wire (NBL) may be coupled to the drain of the transistor 310 using a buried via (BUR BL Via). In some instances, the buried bitline wires (BL/NBL) may refer to unidirectional wires that run parallel to the transistor fins (FIN), which provides for burying and coupling the buried bitline wire (BUR BL Wire) between the transistor fins (FIN). In some implementations, burying the bitline wire in this way may lead to lower capacitance and lower cell read delay as compared to a non-buried bitline wire. Also, in some implementations, the buried bitline wire may further increase memory bitcell density for some memory applications. In some other instances, the wordline (WL) may be implemented as a buried signal wire, and the wordline (WL) wire may be a unidirectional wire that is disposed across the memory structure.

Figure 4:
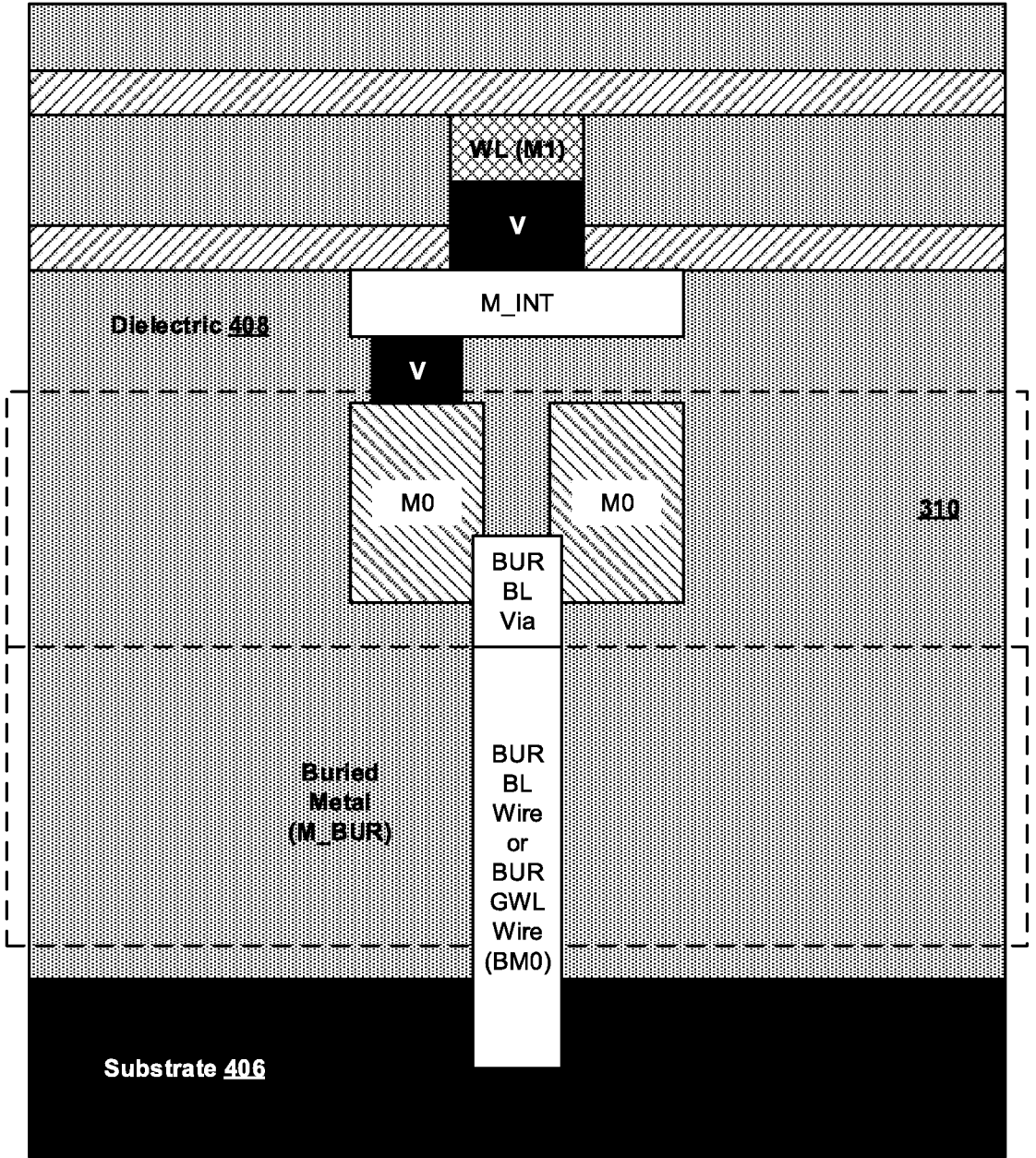

FIG. 4 illustrates a diagram 400 of memory architecture 404 having buried metal lines (M_BUR) in accordance with various implementations described herein. It should be appreciated that the memory architecture 404 as shown in FIG. 4 may be similar in scope and features to the memory architectures 204, 304 as shown in FIGS. 2-3, wherein similar components have similar features, characteristics and related behaviors.

In various implementations, the memory architecture 404 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing memory architecture 404 as an integrated system or device may involve use of the various IC circuit components described herein so as to implement various related fabrication schemes and techniques associated therewith. Also, the memory architecture 404 may be integrated with computing circuitry and related components on a single chip, and the memory architecture 404 may be implemented and/or incorporated in various embedded systems for various automotive, electronic, mobile, server and Internet-of-things (IoT) applications, including remote sensor nodes.

As shown in FIG. 4, the memory architecture 404 may include a multi-layered memory structure with a substrate 406 and one or more signal wires (e.g., BM0) buried within the substrate 406 for transmitting electrical signals. The one or more signal wires (e.g., BM0) may be referred to as buried metal (M_BUR) that is disposed within the substrate 406 and also surrounded (or enclosed) with a dielectric material 408. In some instances, the electrical signals may refer to various types of critical signals (wordline signals, bitline signals and clock signal) that are transmitted to the memory structure for memory related applications.

In some implementations, the memory architecture 404 as shown in FIG. 4 refers to a multi-layered memory structure having a buried wordline wire (BUR WL Wire), which may also be implemented as a buried global wordline wire (BUR GWL Wire). Also, the buried wordline signal wire (BM0) may include a buried via (e.g., BUR WL Wire+BUR WL Via), and another wordline wire (WL) may be provided in the metal layer (M1). In some instances, the global wordline wire (BUR GWL Wire) may refer to a parallel strap to the wordline (WL M1) that may be buried and tapped at various locations, e.g., using one or more buried vias (V), such as at the beginning and the end of the memory structure. The buried via ((BUR WL Via) may be used to couple the buried wordline (BUR WL Wire) to the poly gate (PG) of the transistor 410, which may be provided above the substrate.

Figure 5:
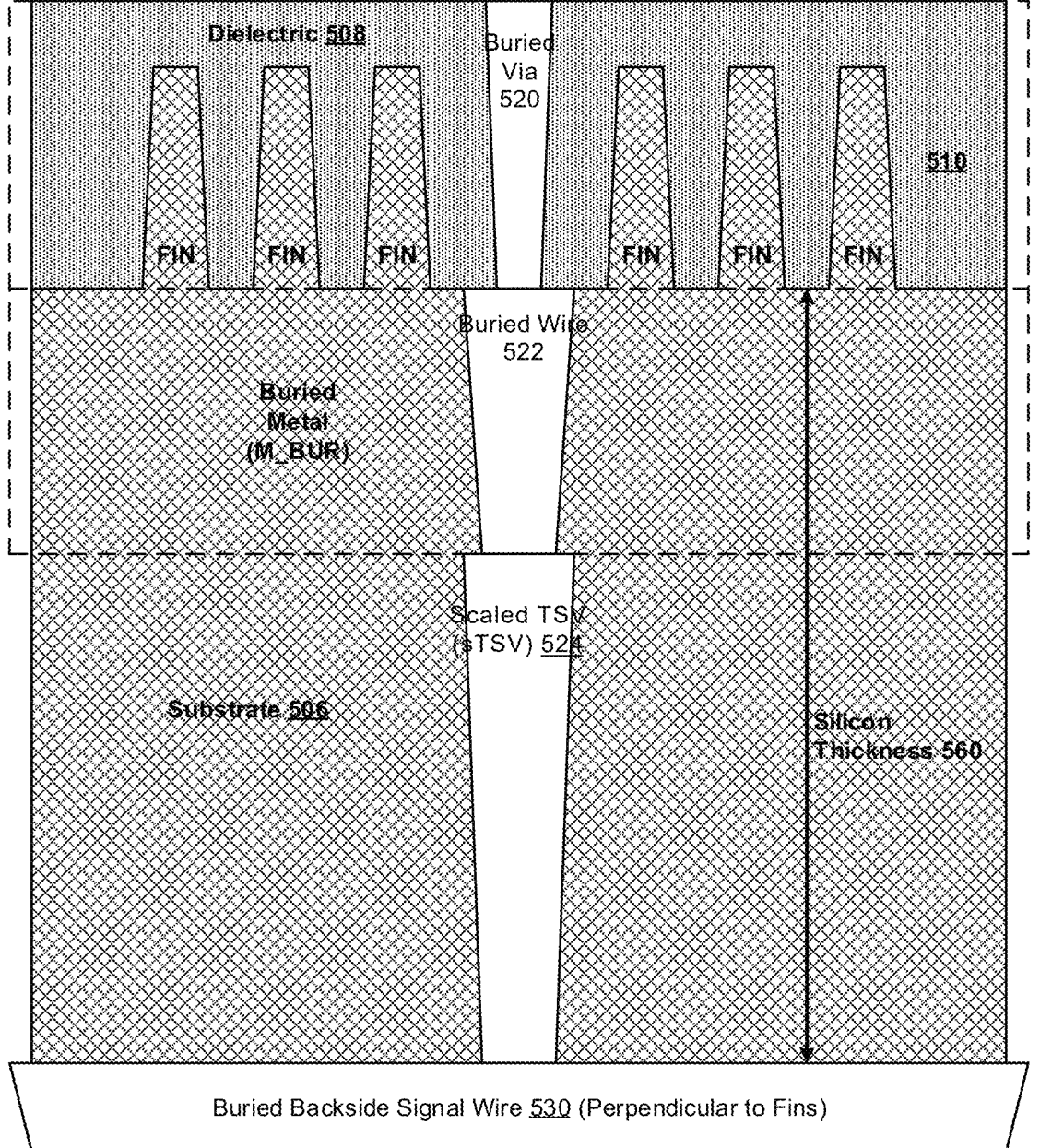

FIG. 5 illustrates a diagram 500 of memory architecture 504 having buried metal lines (M_BUR) in accordance with various implementations described herein. It should be appreciated that the memory architecture 504 as shown in FIG. 5 may be similar in scope and features to the memory architectures 204-404 as shown in FIGS. 2-4, wherein similar components have similar features, characteristics and related behaviors.

In various implementations, the memory architecture 504 may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing memory architecture 504 as an integrated system or device may involve use of the various IC circuit components described herein so as to implement various related fabrication schemes and techniques associated therewith. Also, the memory architecture 504 may be integrated with computing circuitry and related components on a single chip, and the memory architecture 504 may be implemented and/or incorporated in various embedded systems for various automotive, electronic, mobile, server and Internet-of-things (IoT) applications, including remote sensor nodes.

As shown in FIG. 5, the memory architecture 504 may include a multi-layered memory structure with a substrate 506 and one or more signal wires (e.g., BM0) buried within the substrate 506 for transmitting electrical signals. The one or more signal wires (e.g., BM0) may be referred to as buried metal (M_BUR) that is disposed within the substrate 506 and also surrounded (or enclosed) with a dielectric material 508. In some instances, the electrical signals may refer to various types of critical signals (wordline signals, bitline signals and clock signal) that are transmitted to the memory structure for memory related applications.

In some implementations, the memory architecture 504 as shown in FIG. 5 refers to a multi-layered memory structure having a buried backside signal wire 530 that is disposed perpendicular to the transistor fins (FIN). The buried backside signal wire 530 is implemented on the backside of the substrate 506, and the buried backside signal wire 530 is coupled to another buried signal wire 522 with a scaled through-silicon via (TSV) 524. In this instance, the buried signal wire 522 may be coupled to a buried via 520.

In some implementations, the buried signal wires 522, 530 may be coupled to the source, drain or gate of the transistor 510, or to other buried signal wire layers, backside wire layers, or non-buried signal wire layers using the buried via 520 or TSV. Within some process technologies, the buried signal wire 524 may be buried between 23 nm to 90 nm from the top surface of the substrate 506. However, in other process technologies, different depths may be used so as to provide similar technical scope and effects as discussed herein. Also, the substrate 506 may have and be formed with a pre-defined thickness 560.

In various implementations, the substrate 506 may be formed of a semiconductor material, such as, e.g., silicon (Si), or compound III-V, such as gallium-arsenide (GaAs), or II-VI materials, such as gallium-nitride (GaN), silicon-carbide (SiC) and Sapphire. Further, the substrate 506 may be doped with, e.g., boron, phosphorus, arsenic, antimony, or some combination thereof. In some instances, the buried signal wires 522, 530 may be formed of a conductive material, such as, e.g., aluminum, copper, ruthenium, or similar. Moreover, in some instances, the buried via 520 and TSV 524 may be formed of tungsten with dimensions in the range, e.g., of 50-500 nm diameter and 1-10 μm thickness.

In various implementations, as described in reference to FIGS. 1-5, a clock signal wire may be implemented as a buried signal wire; however, the clock signal wire may not be unidirectional or regular, and thus, the clock signal wire may be implemented using multiple buried signal wire layers. In some instances, the memory structure may have a unidirectional buried signal wire clock layer that is coupled to the memory structure using buried vias so as to track the signal grid in another direction on higher non-buried metal layers.

In some implementations, the buried clock signal wire may reduce resistance and capacitance of the clock signal wire when compared with a non-buried signal wire, thereby resulting in improved timing and/or increased dynamic energy efficiency. Also, by removing congestion with buried signal wires, other wired signals in the higher non-buried layers may provide lower capacitance, provide lower resistance and/or result in lower area congestion, e.g., if the clock signal wire is disposed as a buried signal wire in a non-buried wire-dominated memory structure. Further, in some instances, when a high frequency toggling clock injects noise due to coupling capacitance, burying the clock signal wire may also result in providing lower noise injection to various other critical signals in the memory structure.

In some implementations, a memory device may include a single port that allows a single read-write access per cycle time, or the memory device may be multi-ported so as to allow multiple simultaneous read-write accesses, for example e.g., two-port SRAM allows for simultaneous read-write access, and dual-port SRAM allows for simultaneous read-write access (e.g., up to two simultaneous reads, two simultaneous writes, or a simultaneous read and write). For instance, SRAM with N-ports may support N-simultaneous accesses. Also, SRAM with multiple ports may have multiple groups of wordline wires and multiple groups of bitline wires. Therefore, in some instances, the memory device may have multiple groups of bitline wires and multiple groups of wordline wires, wherein one or more bitline wires and/or one or more wordline wires may be buried according to aspects of this disclosure.

In various implementations, various other memory technologies may be used, such as, e.g., DRAM (Dynamic Random-Access Memory), eDRAM (embedded Dynamic Random-Access Memory), MRAM (Magnetic Random-Access-Memory), ReRAM (Resistive Random-Access-Memory), PCM (Phase Change Memory), CeRAM (Correlated Electron Random-Access-Memory), FLASH, NVRAM (Non-Volatile Random-Access Memory), or ROM (Read-Only Memory). For instance, DRAM is a form of volatile memory, and DRAM uses capacitors to store data, wherein the capacitors charge slowly leaks and thus the memory cells must be periodically refreshed. eDRAM is a form of embedded DRAM, and similar to DRAM, eDRAM uses capacitors to store data, wherein the capacitors charge slowly leaks and thus memory cells must be periodically refreshed. SRAM is a volatile memory, and SRAM uses capacitors and transistors to store data, wherein SRAM does not have to be periodically refreshed. MRAM is a non-volatile memory, and MRAM uses magnetic domains to store data. ReRAM is a nonvolatile memory, and ReRAM uses resistance of a dielectric to store data. PCM is a non-volatile memory, and PCM uses state of matter to store data. CeRAM is a non-volatile memory, and CeRAM uses resistance to store data. FLASH is a nonvolatile memory, and Flash memory uses floating gate transistors, wherein there are two types of FLASH memory, NAND FLASH or NOR FLASH. NVRAM covers any non-volatile memory device, e.g., FLASH, ReRAM, MRAM, PCM. ROM is a non-volatile read-only memory.

Also, in various implementations, other memory signal wires may be implemented as buried signal wires, e.g., global control signals, such as a pre-charge wire, a chip select wire, a write enable wire, or a read enable wire. In some instances, the buried signal wires may be implemented in a dielectric region that is disposed parallel to the transistor fins. The buried signal wire may also be coupled to a transistor using buried vias, wherein this idea may provide one layer of routing. Also, the buried signal wires may not be disposed in parallel with the transistor fins; or in cases where multiple layers of buried signal wires are used, the buried signal wires may be fabricated on the backside of the substrate and coupled to the active transistors using a scaled TSV (sTSV) and a combination of buried wires and/or vias. Further, in some cases, the buried signal wires may also be coupled using a micro-Through-Silicon-Via (mTSV) along with backside metal.

Figure 6:
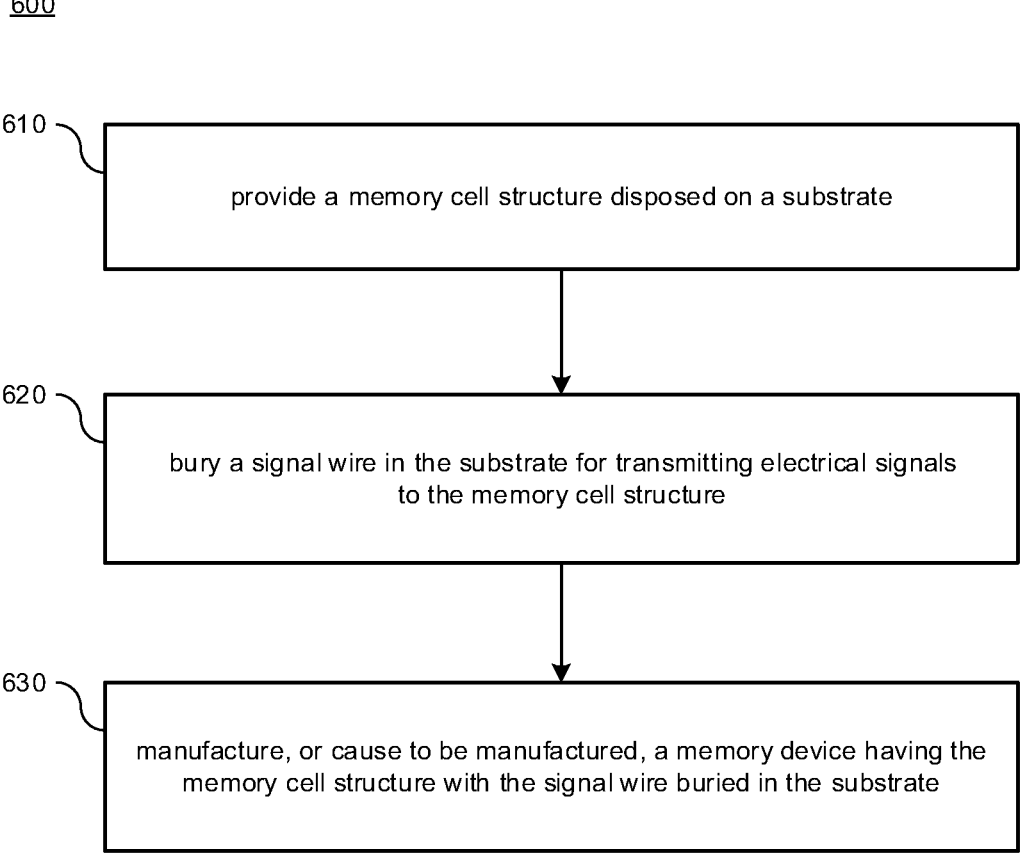
FIG. 6 illustrates a diagram of a method for providing memory architecture with buried metal lines in accordance with various implementations described herein.

FIG. 6 illustrates a diagram of a method 600 for providing memory architecture with buried metal lines (M_BUR) in accordance with implementations described herein.

It should be understood that even though method 600 indicates a particular order of operation execution, in some cases, various portions of operations may be executed in a different order, and on different systems. In other cases, additional operations and/or steps may be added to and/or omitted from method 600. Also, method 600 may be implemented in hardware and/or software. For instance, if implemented in hardware, method 600 may be implemented with various components and/or circuitry, as described in FIGS. 1-5. Also, in other instances, if implemented in software, method 600 may be implemented as a program or software instruction process configured for providing memory architecture having buried metal lines, as described herein. In other instances, if implemented in software, instructions related to implementing method 600 may be stored in memory and/or a database. As such, in various implementations, a computer or various other types of computing devices with a processor and memory may be configured to perform method 600.

As described in reference to FIG. 6, the method 600 may be used for fabricating and/or manufacturing, or causing to be fabricated and/or manufactured, an integrated circuit (IC) that implements various layout schemes and techniques in physical design as described herein so as to provide memory architecture with buried metal lines using various associated devices, components and/or circuitry as described herein.

At block 610, method 600 may be configured to provide a memory cell structure disposed on a substrate. The memory cell structure may refer to a transistor that is disposed on the substrate. In various implementations, the memory cell structure refers to an SRAM bitcell, a DRAM bitcell, an eDRAM bitcell, an MRAM bitcell, a ReRAM bitcell, a PCM bitcell, a CeRAM bitcell, a FLASH bitcell, an NVRAM bitcell or a ROM bitcell.

At block 620, method 600 may be configured to bury a signal wire in the substrate for transmitting electrical signals to the memory cell structure. In some implementations, the electrical signals may refer to critical signals that are transmitted to the transistor by way of the buried signal line for memory related applications. In other implementations, the electrical signals may refer to power signals that are transmitted to the transistor by way of the buried signal line for memory related applications.

At block 630, method 600 may be configured to manufacture, or at least cause to be manufactured, a memory device with the memory cell structure and the signal wire buried in the substrate. In various implementations, the memory device may refer to SRAM, DRAM, eDRAM, MRAM, ReRAM, PCM, CeRAM, FLASH, NVRAM or ROM.

In some implementations, the signal wire may be coupled to the transistor with a buried via or a through-silicon via (TSV). The signal wire may refer to a wordline, a bitline or clock signal line that is buried in the substrate. The signal wire may refer to a bitline buried in a shallow trench isolation region that is filled with a dielectric material.

In some implementations, the signal wire may refer to multiple signals wires buried in the substrate for transmitting electrical signals to the transistor. The multiple signals wires may include a buried wordline coupled to a gate of the transistor with a first buried via, and the multiple signals wires may include a buried bitline coupled to a drain of the transistor with a second buried via. The buried wordline may refer to a buried global wordline that is coupled to the gate of the transistor with the first buried via.

In some implementations, the critical signals may refer to data signals and/or clock signals that are transmitted to the memory cell structure for memory related applications. The multiple signal wires may include at least one wordline and at least one bitline that are buried in the substrate. The critical signals may refer to one or more wordline signals that are transmitted on the at least one wordline to the memory cell structure, and the critical signals may refer to one or more bitline signals that are transmitted on the at least one bitline to the memory cell structure. The multiple signal wires may include at least one clock signal line that is buried in the substrate, and the critical signals refer to one or more clock signals that are transmitted on the at least one clock signal line to the memory cell structure.

In some implementations, the multiple signal wires may include a combination of buried signal lines and buried power lines. The multiple signal wires may have at least one critical signal line buried in the substrate for transmitting critical signals to the memory cell structure, and the multiple signal wires may have at least one power signal line buried in the substrate for transmitting power signals to the memory cell structure. Also, the at least one critical signal line is separate from the at least one power signal line.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a memory structure with a substrate. The device may include a signal wire buried or partially buried within at least one of the substrate and a dielectric for transmitting electrical signals.

Described herein are various implementations of a device having a memory cell structure disposed on a substrate. The device may include multiple signal wires buried or partially buried within a least one of the substrate and a dielectric for transmitting critical signals to the memory cell structure.

Described herein are various implementations of a method. The method may provide a memory cell structure disposed on a substrate. The method may bury or partially bury a signal wire in the substrate for transmitting electrical signals to the memory cell structure. The method may manufacture, or cause to be manufactured, a memory device with the memory cell structure and the signal wire buried or partially buried in the substrate.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
a memory structure having a substrate; and
a signal wire buried or partially buried within at least one of the substrate at a depth below a bottom of a transistor fin, or within a backside dielectric of the substrate, for transmitting electrical signals.

2. The device of claim 1, wherein the electrical signals refer to critical signals that are transmitted for memory related applications.

3. The device of claim 1, wherein:
the memory structure includes a transistor disposed on the substrate, and
the electrical signals refer to critical signals transmitted to the transistor for memory related applications.

4. The device of claim 1, wherein:
the memory structure includes a transistor disposed on the substrate, and
the signal wire is coupled to the transistor with a buried via or a through-silicon via.

5. The device of claim 1, wherein the signal wire refers to a wordline, a bitline or a clock signal line.

6. The device of claim 1, wherein:
the memory structure includes a transistor disposed on the substrate, and
the signal wire refers to multiple signals wires.

7. The device of claim 6, wherein:
the multiple signals wires include a buried wordline coupled to a gate of the transistor with a first buried via.

8. The device of claim 6, wherein:
the multiple signals wires include a buried bitline coupled to a drain of the transistor with a second buried via.

9. The device of claim 7, wherein the buried wordline refers to a buried global wordline that is coupled to a local wordline through the first buried via and at least one of the gate of the transistor, a drain of the transistor, or a direct metal connection.

10. The device of claim 1, wherein the memory structure refers to SRAM, DRAM, eDRAM, MRAM, ReRAM, PCM, CeRAM, FLASH, NVRAM or ROM.

11. A device comprising:
a memory cell structure disposed on a substrate; and
multiple signal wires buried or partially buried within a least one of the substrate at a depth below a bottom of a transistor fin, or within a backside dielectric of the substrate, for transmitting critical signals to the memory cell structure.

12. The device of claim 11, wherein the critical signals refer to data signals or clock signals that are transmitted to the memory cell structure for memory related applications.

13. The device of claim 11, wherein the multiple signal wires include at least one wordline and at least one bitline.

14. The device of claim 13, wherein:
the critical signals refer to one or more wordline signals that are transmitted on the at least one wordline to the memory cell structure, and

the critical signals refer to one or more bitline signals that are transmitted on the at least one bitline to the memory cell structure.

15. The device of claim 11, wherein:

the multiple signal wires include at least one clock signal line that is buried in the substrate.

16. The device of claim 11, wherein:

the multiple signal wires include at least one critical signal line for transmitting critical signals to the memory cell structure, the multiple signal wires include at least one power signal line for transmitting power signals to the memory cell structure, and the at least one critical signal line is separate from the at least one power signal line.

17. The device of claim 11, wherein the memory cell structure refers to an SRAM bitcell, a DRAM bitcell, an eDRAM bitcell, an MRAM bitcell, a ReRAM bitcell, a PCM bitcell, a CeRAM bitcell, a FLASH bitcell, an NVRAM bitcell or a ROM bitcell.

14

18. A method comprising:

providing a memory cell structure disposed on a substrate;

burying or partially burying, within at least one of the substrate at a depth below a bottom of a transistor fin, or within a backside dielectric of the substrate, a signal wire for transmitting electrical signals to the memory cell structure; and manufacturing, or causing to be manufactured, a memory device having the memory cell structure with the signal wire buried or partially buried in the substrate.

19. The method of claim 18, wherein:

the memory cell structure includes a transistor disposed on the substrate, and the electrical signals refer to critical signals that are transmitted to the transistor by way of the buried signal wire for memory related applications.

20. The method of claim 18, wherein the memory cell structure refers to an SRAM bitcell, a DRAM bitcell, an eDRAM bitcell, an MRAM bitcell, a ReRAM bitcell, a PCM bitcell, a CeRAM bitcell, a FLASH bitcell, an NVRAM bitcell or a ROM bitcell.

* * * * *